Figure 1:
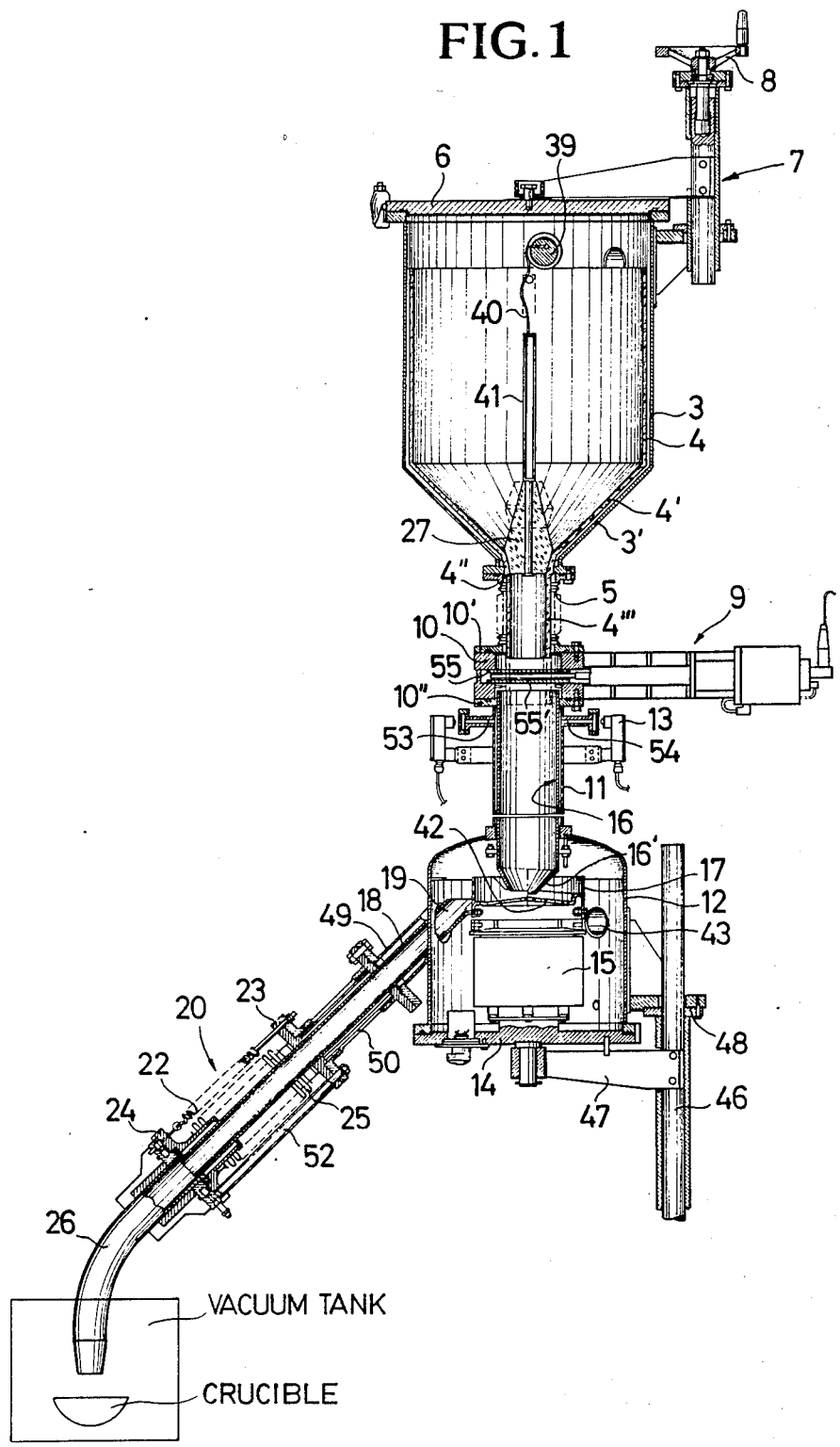

United States Patent [19]

Drechsel et al.

[11] Patent Number: 4,904,143
[45] Date of Patent: Feb. 27, 1990

[54] APPARATUS FOR THE CONTINUOUS FEEDING OF MATERIAL TO BE MELTED

[75] Inventors: Dieter Drechsel, Bruchkoebel; Karl Jericho, Hanau, both of Fed. Rep. of Germany

[73] Assignee: Leybold Aktiengesellschaft, Hanau, Fed. Rep. of Germany

[21] Appl. No.: 148,926

[22] Filed: Jan. 27, 1988

[30] Foreign Application Priority Data

Oct. 31, 1987 [DE] Fed. Rep. of Germany ....... 3737051

[51] Int. Cl.⁴ .......................... B01J 4/00; C30B 15/02
[52] U.S. Cl. .................... 414/217; 141/263; 414/200
[58] Field of Search ............... 414/217, 221, 152, 156, 414/165, 210, 199-206, 216; 222/160, 162; 141/263, 264; 432/97, 98; 266/184, 200

[56] References Cited

U.S. PATENT DOCUMENTS

| 990,555 | 4/1911 | Hitchcock | 414/165 |
|---|---|---|---|
| 1,589,011 | 6/1926 | Langworthy | 222/160 |
| 1,713,543 | 5/1929 | Machlet | 432/97 X |
| 3,139,479 | 6/1964 | Evans | 414/200 X |
| 3,573,337 | 4/1971 | Grimm et al. | 414/200 X |
| 3,633,897 | 1/1972 | Vogel | 414/204 X |
| 3,680,849 | 8/1972 | Niebor | 414/202 |
| 4,071,151 | 1/1978 | Farber | 414/199 X |
| 4,212,317 | 7/1980 | Patrick et al. | 414/217 X |
| 4,668,478 | 5/1987 | Homer et al. | 414/199 X |

FOREIGN PATENT DOCUMENTS

| 0170856 | 2/1986 | European Pat. Off. . |
|---|---|---|
| 2821481 | 12/1985 | Fed. Rep. of Germany . |
| 845505 | 8/1960 | United Kingdom . |

Primary Examiner—David A. Bucci
Attorney, Agent, or Firm—Felfe & Lynch

[57] ABSTRACT

In an apparatus for the continuous feeding of material to a melting crucible in the pulling of monocrystals in a vacuum tank, a first container (3) is provided which is provided with an internal lining (4) adapted to the container shape and having a funnel-shaped section (4') and a cylindrical outlet (4''') adjoining the latter, the outlet (4''') being displaceable through a lock valve (10) into the connecting pipe (11) of a second container (12) which in turn, through an outlet tube (18) with elbow (19) brought through the wall of the vacuum tank, leads into the area above the melting crucible. The two containers (3, 12) are for that purpose coupled with the hydraulic cylinder (28) of a linear actuator by which the distance between the two containers (3, 12) can be varied.

13 Claims, 3 Drawing Sheets

APPARATUS FOR THE CONTINUOUS FEEDING OF MATERIAL TO BE MELTED

The invention relates to an apparatus for the continuous feeding of material to be melted to the melting crucible in the pulling of monocrystals in a vacuum tank with a sealable container, a shaking apparatus, and an outlet tube leading into the crucible and connected to the container.

In the known apparatus for pulling monocrystals, the melting crucible is filled with the material to be melted, such as silicon granules, prior to evacuating the tank surrounding the melting crucible. It has already been proposed in DE-OS 28 21 481 to add granulated silicon during the pulling process through a heated fused quartz tube passing from the outside through the tank wall and the outer part of the apparatus and plunging into the molten silicon.

Finally, it is known (EP 0 170 856) to dispose outside of the tank a system for feeding the granulated silicon, whose outlet tube communicates with a cylindrical vessel partially filled with granules, in which a motor-driven metering disk rotates which has recesses which fill with granules when the disk passes through the quantity of granules accumulated on the one side of the tank. The disk then carries the picked-up portion of granules in front of the one end of the outlet tube, so that it can then slide down through the outlet tube into the melting crucible. The cylindrical tank is furthermore connected by a connecting pipe, into which an isolation valve is inserted, to a second container in which the granules are reserved, while a piston which can be moved by hand transports these granules, when the valve is open, into the connecting pipe and thus into the container with the metering disk.

It is the object of the present invention to create an apparatus of the kind described above, which will operate very reliably and uniformly, whose operation is easily monitored, which operates continuously, not portion-wise, and which permits virtually uninterrupted operation.

This is accomplished according to the invention in that the first container with an interior lining adapted to the container shape is provided with a funnel-shaped section and a cylindrical outlet terminating the latter, the outlet being displaceable by the lock valve into the connecting pipe of the second container, which in turn leads into the area above the melting crucible through an outlet tube brought through the wall of the vacuum tank.

Preferably, the section of the first tank surrounding the funnel-shaped portion of the lining is connected hermetically by a bellows to the inlet part of the lock valve, the outlet portion of the lock valve being connected hermetically to the top of the second housing by the connecting pipe.

This permits a largely gap-free lining of the individual parts of the apparatus with a nonmetallic material, such as fused quartz, for example, so that the entry of metal detritus into the melt is prevented.

To prevent destruction of the lining by the closing of the lock valve, the upper container is coupled by a bracket to the moving member of a device by which the distance between the two containers is variable.

The pipe connecting the lock valve to the second, lower container is advantageously provided with an internal tubular lining whose bottom end is prolonged into the second container and is in the form of a funnel-shaped portion.

To assure a uniform movement of the granules, a shaking device is provided in the second container, and has a pan that can be moved by it, into which pan the funnel-shaped portion of the tubular lining or the connecting pipe surrounding the latter discharges from above, the pan having an outlet or a funnel which corresponds with the outlet tube.

The outlet tube is best at least partially surrounded by a protective tube whose one end is fixedly connected to the second container and hose other end is fixedly joined to the flange of a bellows.

To be able to view the transport of the granules from the second container into the outlet tube, the protective tube is provided with openings or holes, and the outlet tube is formed of a transparent material such as quartz for example.

Preferably the bellows surrounds the free end of the outlet tube, the crucible end of the bellows having a flange which can be fastened to the one end of an elbow reaching into the area of the crucible.

In this manner it is possible to dispose the apparatus in the immediate vicinity of the vacuum tank, since all vibrations which might be produced by the shaking device are isolated by the elbow passing through the wall of the tank.

To permit the cover of the tank forming the vacuum chamber to be opened, a movable device is disposed between the outlet tube and the elbow, the two flanges of the bellows being joined to one another by tension springs and guided against one another on rods, the crucible end of the outlet tube being hermetically surrounded by the flange at the crucible end. The flange at the crucible end is furthermore in two parts, the second part being fixedly connected to the elbow so that at this point the outlet tube is separable from the elbow.

In a preferred embodiment the connecting pipe between the lock valve and the second container has bores situated diametrically opposite one another, sensors of a photoelectric cell being disposed in line with these bores, which permit a precise control of the amount of bulk material on hand.

To permit a controlled feeding of the granules from the first container into the connecting pipe, a stopper displaceably disposed in the first container is provided for the closing of the funnel-shaped portion of the lining; its end adjacent the cover is connected to a pull rope which cooperates with a spindle journaled in the upper part of the wall of the container, a turning of the spindle producing a shortening of the free part of the pull rope, and a raising of the stopper and thus the outflow of the bulk material.

Preferably the shaking device with the pan disposed on its upper end is fastened on the inside of the downwardly removable cover, the cover being operatively connected by an arm to the vertically movable locking rod of a linear actuator. In this manner it is assured that the lower container can also be opened without the need for dismounting or moving the device as a whole.

Figure 2:
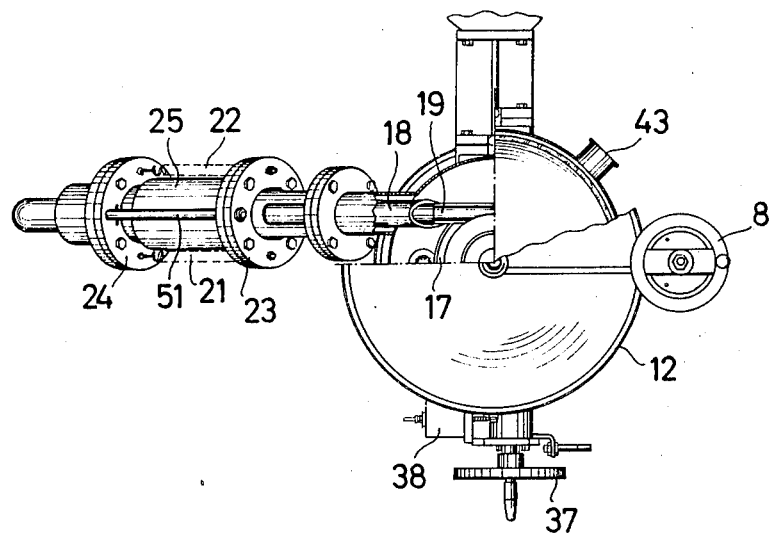
Figure 3:
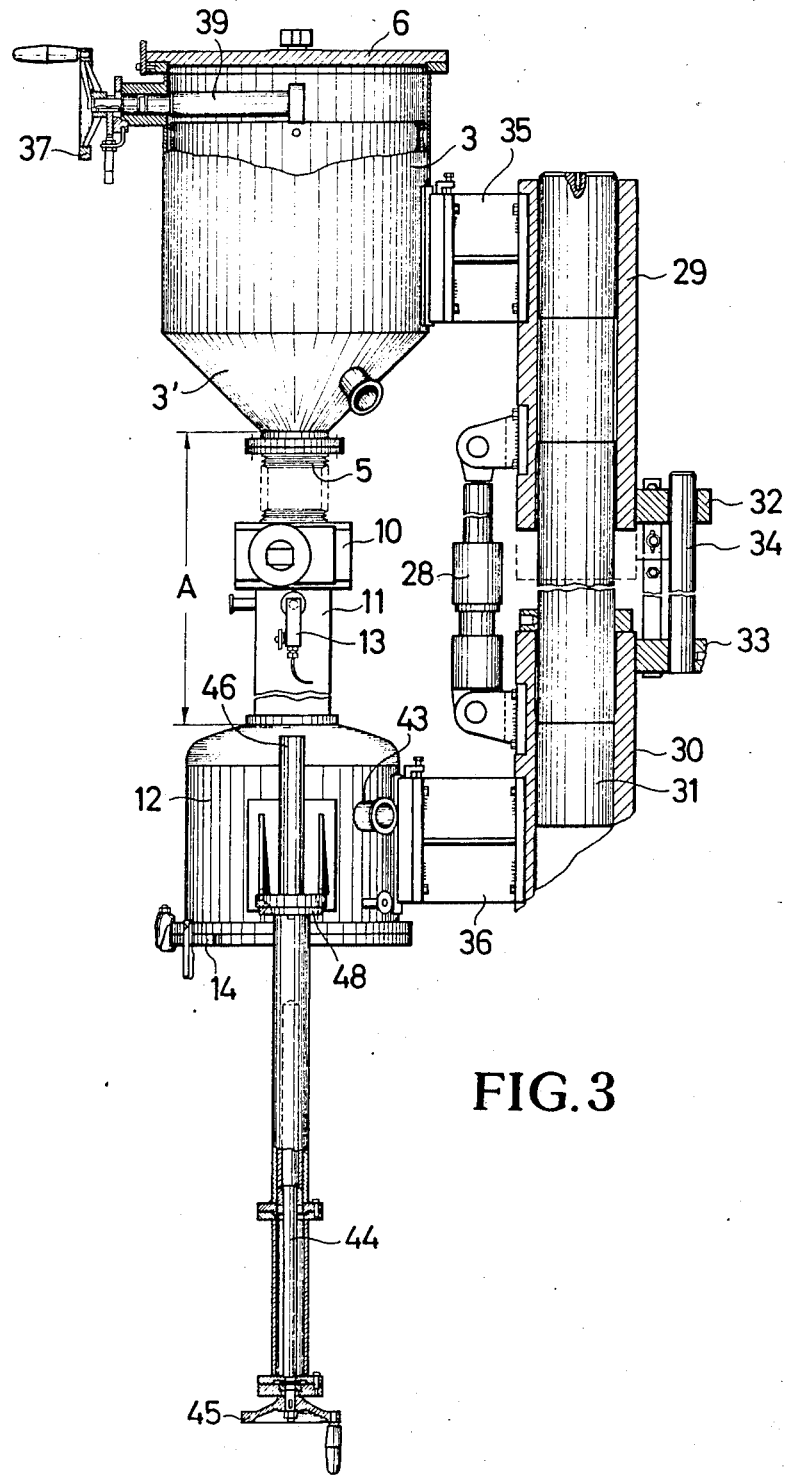

The invention admits of many different embodiments; one of them is represented diagrammatically in the appended drawings, wherein:

FIG. 1 shows a longitudinal section through the reloadable, continuously operating charging system FIG. 2 is a partially cut away plan view of the apparatus according to FIG. 1 showing part of the lower container FIG. 3 is a side view of the apparatus The apparatus consists essentially of the upper container 3 provided with a lining 4, a bellows 5 connected to the conical section of the container 3, a cover 6 which closes the container 3 and can be operated by a closing system 7 with hand wheel 8, a lock valve 10 which can be opened by an actuator means 9, a connecting pipe 11 with a photoelectric cell 13, a lower container 12 with a shaker means 15 fastened to the cover 14, a system, formed by a spindle 44 with handwheel 45, lock rod 46 with bracket 47 and guide bearing 48, for opening and closing the cover 14, a funnel 16 provided on the connecting pipe 11 and discharging into a pan 17 of fused silica, which in turn communicates with the outlet tube 18 through a funnel 19, and lastly a resilient body 20 with coil springs 21 and 22 which engage flanges 23 and 24, a bellows 25, and an elbow 26.

The operation of the charging system is as follows:

The conical stopper 27 is placed in the funnel-shaped outlet 4" of the lining 4 and the bulk material is loaded. The top cover 6 is closed and the upper container 3 is evacuated. When the pressures in the upper and lower containers are equal, the lock valve 10 opens. In the open state the lock valve 10 permits the contents of the upper container to descend. The upper container 3 is hydraulically lowered against the bellows 5; the actuating means consisting of the hydraulic cylinder 28, the guide tubes 29 and 30 with the guide lugs 32 and 33, the guide rod 31, the rod 34 and the brackets 35 and 36 are provided for this purpose, as seen in FIG. 3. The cylindrical outlet 4''' of the lining 4 leads through the lock valve 10 into the cylindrical connecting pipe 11. In the lock valve 10 there is a sealing lip which seals the outlet 4''' of the lining 4, so that no dust can enter into the lock valve 10. When the upper container 3 is in the lower position, the hand wheel 37 (FIG. 2), which is locked up by a magnet 38, is released and the stopper 27 in the funnel-shaped outlet 4" can be raised upward by turning the handwheel 37 through the spindle 39, the wire rope 40 and the rod 41. The bulk material drops through the cylindrical outlet 4''', which is fastened above the shaker 15, onto the floor 42 of the container of the shaker 15. The bulk material piles up in the container 17 over the shaker. By the varying movement of the shaker 15 the bulk material is driven through an outlet chute or funnel 19 to the outlet tube and from there through the elbow 26 into the crucible. Through the inspection glass 43 in the pipe 44 of the lower container 12, an optical inspection of the charge material being fed to the crucible is possible.

The substantially cylindrical lining 4 is tapered at its bottom end. The tapered section 4' differs according to the bulk material. The distance between the bottom end of the tapered section 4' and the bottom 42 of the container 17 is adjustable and can be adjusted to a particular dimension depending on the taper configuration.

The photoelectric cell 13 serves as an indication of the level of the charge in the upper container 3. If the material of the upper container 3 has dropped to the level of the photoelectric cell 13, the upper container 3 is hydraulically raised by the system 28 to 36. The passage through the lock becomes free and the lock valve 10 automatically closes. The upper container 3 is flooded, the cover 6 is opened by the closing system 7 and the stopper 27 in the funnel-shaped outlet 4" is closed. Then fresh bulk material can be loaded into the upper container 3. The charging process is repeated as described above. This recharging of the upper container 3 can be continued as desired. During the recharging there is enough bulk material in the connecting pipe 11 and in dish 17 that the continuous feeding of the crucible is not interrupted.

It is also to be noted that the cylindrical outlet 4''' is surrounded by the lips of two seals 55, 55', when the upper container 3 is in its lowered position, so that dust rising up in the lining 16 protects the lock valve 10 against contamination.[*] The seals 55 and 55' are for this purpose so arranged that one seal 55' is above and the other seal 55 below the valve slide.

We claim:

1. Apparatus for the continuous feeding of material for melting to a melting crucible in the pulling of monocrystals in a vacuum tank, comprising:

sealable containers at a distance from each other, a lock valve, one container having a shape being provided with an internal lining corresponding to the container shape, with a funnel-shaped section and a cylindrical outlet adjoining said funnel-shaped section, a second container having a connecting pipe, the lock valve being disposed between the outlet of the one container and the connecting pipe of the second container, means for displacing the outlet through the lock valve into the connecting pipe, and the second container having an outlet tube brought through a wall of a vacuum tank into an area above a crucible.

2. Apparatus according to claim 1, which includes a section of the one container which surrounds the funnel-shaped section of the lining, the lock valve having an inlet part and an outlet part, a bellows connecting hermetically the funnel-shaped section of the lining of first container to the inlet part of the lock valve, the outlet part of the lock valve being connected by the connecting pipe to a top of the second container.

3. Apparatus according to claim 1, which includes an actuator of a system by which the distance between the two containers is variable and which includes a bracket for coupling the one container to the actuator.

4. Apparatus according to claim 1, in which the pipe connecting the lock valve with the second container has an internal tubular lining whose lower end is prolonged into the second container and is funnel-shaped.

5. Apparatus according to claim 4, which includes a shaking device disposed in the second container with a pan moved by the shaking device, into which the funnel-shaped lower end of the tubular lining leads from above, the pan having an outlet which communicates with the outlet tube.

6. Apparatus according to claim 1, which includes a bellows having a first flange and which includes a protective tube surrounding at least partially the outlet tube, the protective tube having one end fixedly joined to the second container and having another end fixedly joined to the bellows flange.

7. Apparatus according to claim 6, in which the protective tube has an opening and the outlet tube is formed of a transparent material.

8. Apparatus according to claim 6, in which the outlet tube has a free end and in which the bellows surrounds the free end of the outlet tube and has a crucible end having a second flange and in which the apparatus includes an elbow extending into a region of the crucible and in which the flange of the crucible end can be connected to an end of the elbow.

9. Apparatus according to claim 8, which includes tension springs and rods and in which the outlet tube has a crucible end and in which the first and second flanges of the bellows are connected together by the tension springs and are guided to one another on rods, the crucible end of the outlet tube being surrounded hermetically by the crucible end flange.

10. Apparatus according to claim 1, in which the connecting pipe of the second container has bores situated diametrically opposite one another, and which apparatus includes sensors of a photoelectric cell disposed in line with these bores.

11. Apparatus according to claim 1, which includes a stopper disposed displaceably in the first container and in which the lining has a funnel-shaped portion and in which the stopper closes the funnel-shaped portion and which apparatus includes a pull rope and a cooperating spindle journaled in an upper part of a wall of the first container, a turning of the spindle producing a shortening of a free portion of the pull rope and thus producing a lifting of the stopper.

12. Apparatus according to claim 5, which includes a cover that is removable downwardly and a linear actuator having a vertically movable locking rod, and in which the shaking device has the pan disposed on its upper end and is fastened on the cover that is removable downwardly, the cover being operatively connected to the vertically movable locking rod of the linear actuator.

13. Apparatus according to claim 1, in which the lock valve has a lip seal cooperating with the cylindrical outlet, which, when the outlet is opened, protects the lock valve against contamination by dust rising in the lining.

* * * * *